(12) United States Patent
Greene

(10) Patent No.: US 7,233,208 B2
(45) Date of Patent: Jun. 19, 2007

(54) BIAS COMPENSATION CIRCUIT FOR RF POWER AMPLIFIER

(75) Inventor: Matthew Russell Greene, Crystal Lake, IL (US)

(73) Assignee: Amptech Incorporated, Westlake Village, CA (US)

( * ) Notice: Subject to any disclaimer, the term of this patent is extended or adjusted under 35 U.S.C. 154(b) by 54 days.

(21) Appl. No.: 11/036,088

(22) Filed: Jan. 13, 2005

(65) Prior Publication Data

US 2006/0152287 A1    Jul. 13, 2006

(51) Int. Cl.
*H03F 3/04* (2006.01)
(52) U.S. Cl. ........................... 330/296; 330/285
(58) Field of Classification Search ............. 370/296, 370/285, 288
See application file for complete search history.

(56) References Cited

U.S. PATENT DOCUMENTS

| | | | |
|---|---|---|---|
| 6,300,837 B1 * | 10/2001 | Sowlati et al. | 330/296 |
| 6,791,418 B2 * | 9/2004 | Luo et al. | 330/296 |
| 6,809,593 B1 * | 10/2004 | Newman et al. | 330/285 |
| 6,882,227 B2 * | 4/2005 | Barry et al. | 330/296 |
| 2004/0212433 A1 | 10/2004 | Newman et al. | |

* cited by examiner

*Primary Examiner*—Henry Choe
(74) *Attorney, Agent, or Firm*—Brinks, Hofer, Gilson & Lione

(57) ABSTRACT

An electronic circuit contains a controller integrated circuit and a power amplifier MMIC connected to the controller IC. The power amplifier MMIC contains a radio frequency power amplifier. The RF power amplifier is a double heterojunction bipolar transistor. The controller IC has an operational amplifier that supplies a DC bias to the base of the RF power amplifier through a ballast resistor. The operational amplifier has an output slope that compensates either partially or entirely for the voltage drop across the ballast resistor. A reference circuit in the power amplifier is disposed close enough to the power amplifier to mirror fluctuations in the base-emitter voltage caused by temperature fluctuations.

37 Claims, 6 Drawing Sheets

BIAS COMPENSATION CIRCUIT FOR RF POWER AMPLIFIER

FIELD

This invention relates to power amplifiers, and more particularly, to a compensation circuit for a power amplifier.

BACKGROUND

Radio frequency (RF) power amplifier devices (i.e. power amplifiers and the associated circuitry) are used in a large number of applications, such as cellular telephones and other telecommunication devices. As in many electronic devices, when designing power amplifier devices, various output characteristics and design tradeoffs are considered. For example, the gain, ruggedness, stability, output power, efficiency, and linearity of the devices are taken into account to some extent when designing power amplifier circuitry.

Power amplifiers are fabricated with a base, collector and emitter, for bipolar transistors or with a gate, source and drain, for field-effect transistors. The following description will refer to bipolar transistors for convenience. Generally, the power amplifier device has multiple current paths that exist in parallel or multiple transistors connected in parallel in the monolithic device. However, the current and temperature distributions are different between the different paths. This leads to a phenomenon called current collapse, in which there is an abrupt increase in the collector current as the base-emitter voltage of the power amplifier decreases. Current collapse occurs when a particular path (usually the center path, if multiple current paths exist for a single transistor, or supplying a particular transistor if multiple transistors are present) begins to draw a majority of the collector current because of the non-uniform current distribution, leading to a decrease in the current gain of the power amplifier. Increasing the power density also tends to increase the current collapse problem. Current collapse also occurs when multiple parallel power amplifiers are present in a power amplifier device. If the resistances of the power amplifiers vary due to heating or process differences, for example, collapse occurs in the power amplifier having the lowest resistance. Current collapse degrades the power performance of the power amplifier.

Typically, the distribution of the current in the power amplifiers is controlled using ballasting to avoid the collapse caused by the different characteristics between the current paths or between different transistors (or cells). Ballasting prevents any individual path or cell from taking too much current. More specifically, a ballast resistor having a relatively large resistance is connected between the power amplifier and the bias source. Increasing the resistance of the ballast resistor also aids in isolation between the DC bias and the RF input. However, as the output power increases, the base current increases, thereby increasing the voltage drop across the ballast resistor. Thus, as the ballast resistor increases, the amplifier saturates at lower power levels. Thus, increasing the value of the ballast resistor negatively impacts the maximum output power, efficiency and linearity of the power amplifier.

BRIEF SUMMARY

By way of introduction only, in a first aspect, a circuit comprises a plurality of integrated circuits ("ICs") including a controller IC and a power amplifier IC connected to the controller IC. The power amplifier IC contains an RF power amplifier. The controller IC contains a bias source, such as an op-amp, that supplies a DC bias to the RF power amplifier through a ballast resistor. The bias source is dynamically adjustable such that a voltage drop across the ballast resistor is compensated. The circuit may be disposed in a portable electronic device, such as a cellular telephone.

In such an aspect, the op-amp has an input/output characteristic that in whole or in part compensates for the resistance of the ballast resistor. The RF power amplifier in one example is a double heterojunction bipolar transistor. A reference circuit, such as a current mirror reference device, establishes the base-emitter voltage to be applied to the power amplifier. The reference circuit is disposed close enough to the power amplifier to mirror fluctuations in the power amplifier caused by temperature fluctuations. The reference circuit also mirrors fluctuations in the power amplifier caused by changes in the processes used to fabricate the power amplifier.

In another aspect, the controller IC contains compensating means for supplying a compensated DC bias to the power amplifier. The compensated bias compensates for a voltage drop across a resistance between the compensating means and the power amplifier.

In another aspect, a method comprises connecting a controller IC and a power amplifier IC containing a power amplifier; compensating for a voltage drop across resistance between the controller IC and a power amplifier by supplying a compensated bias signal to the power amplifier; and amplifying an RF signal supplied to the power amplifier.

In other embodiments, a portable electronic device (such as a cellular telephone) comprises a controller integrated circuit and a power amplifier IC connected to the controller IC. The power amplifier IC and controller IC are similar to those described above.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE EMBODIMENTS

A power amplifier circuit contains a controller integrated circuit and a power amplifier Microwave Monolithic Integrated Circuit (MMIC) connected to the controller integrated circuit (IC). The power amplifier MMIC contains a radio frequency (RF) power amplifier. The power amplifier is a bipolar transistor such as a double heterojunction bipolar transistor (DHBT) or a field effect transistor (FET), for example. The controller IC has an operational amplifier (op-amp) that supplies current to the base of the power amplifier through a ballast resistor to DC bias the power amplifier. The current from the op-amp decreases as the output power from the power amplifier decreases. The op-amp has an output I-V slope that compensates for the voltage drop across the ballast resistor such that the base voltage at the power amplifier is maintained. The power amplifier thus is able to supply a desired amount of gain with better output characteristics, better isolation between the DC bias and the RF input, and lower current drain.

Figure 1:
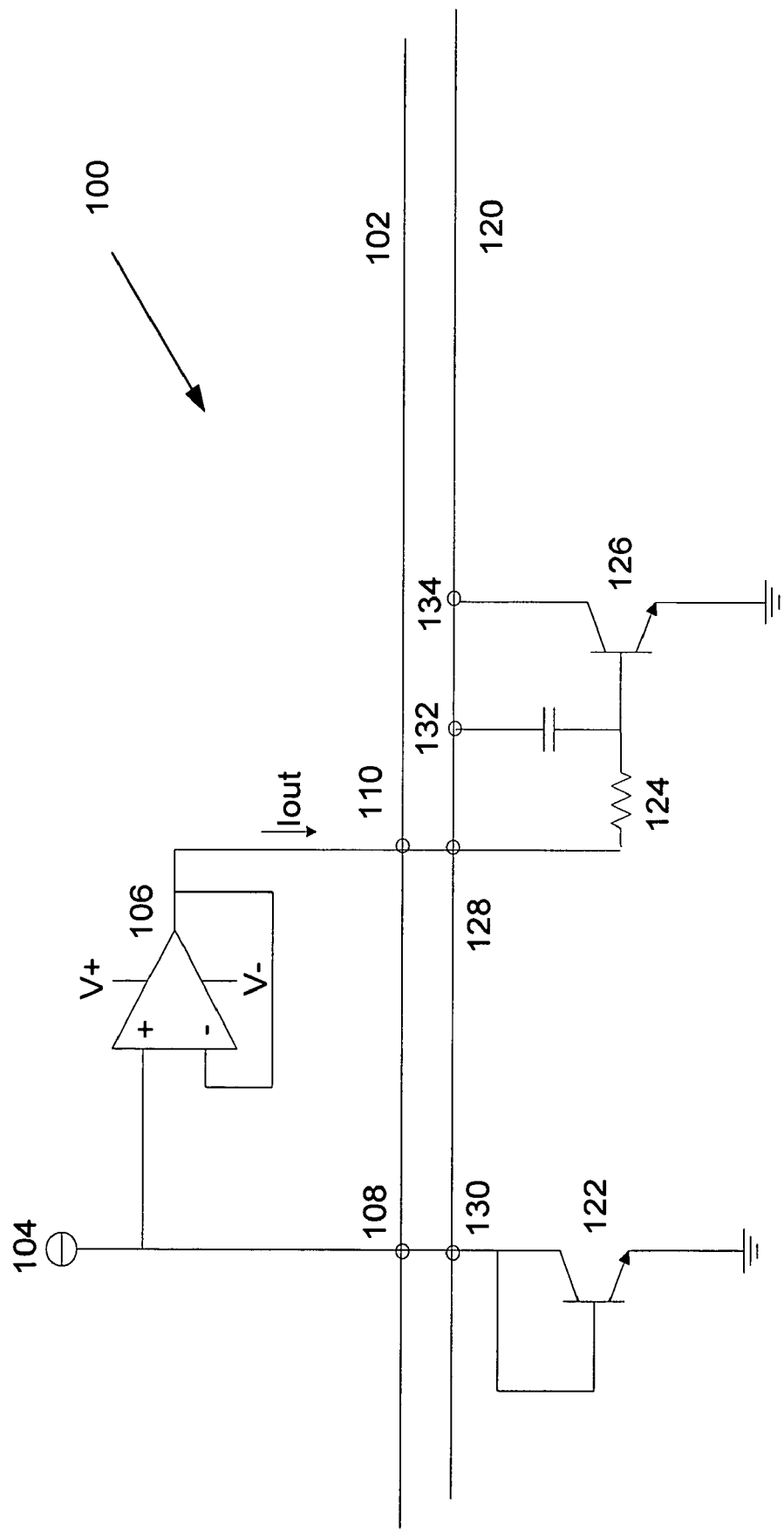
FIG. 1 is a circuit diagram of a first embodiment.

As shown in FIG. 1, the power amplifier device 100 includes two ICs: a controller IC 102 and a power amplifier IC 120. The power amplifier device 100 is powered by a battery (not shown) or other power source. The ICs and devices formed in both ICs are fabricated and connected using techniques known to one of skill in the art, and are therefore omitted in the descriptions herein.

The controller IC 102 in the illustrated embodiment is a Complementary Metal-Oxide Semiconductor (CMOS) IC. The CMOS controller IC 102 employs integrated field-effect transistors (FETs) in a complementary symmetry arrangement, using both p-channel and n-channel FETs. The CMOS controller IC 102 is typically fabricated on a Si substrate from Si-based materials.

The CMOS controller IC 102 contains a constant current source 104 and an operational amplifier (op-amp) 106. The constant current source 104 is fabricated using any suitable circuit design. The constant current source 104 is connected to the positive input terminal of the op-amp 106 and to the Vin terminal 108 of the CMOS controller IC 102. The op-amp 106 is supplied with power via V+ and V− terminals. The op-amp 106 has negative feedback between the output terminal and the negative input terminal of the op-amp 106. The output terminal and the negative input terminal of the op-amp 106 are connected together. Although a direct connection is shown between the terminals, one or more passive or active components such as resistors, capacitors, transistors, may be disposed in the connection. The output of the op-amp 106 is connected to a Vout terminal 110 of the CMOS controller 102.

The power amplifier IC 120 is a MMIC. A MMIC combines active elements, such as diodes and transistors, with passive elements, such as resistors, capacitors inductors, and transmission lines, on a semiconductor substrate. As the MMIC operates at RF frequencies, the MMIC is usually fabricated using compound semiconductors such as GaAs or InP-based semiconductors. RF frequencies include frequencies between about 100 MHz and about 10 GHz, although other frequency ranges are also possible.

The power amplifier IC 120 contains double heterojunction bipolar transistors (DHBT) devices in which the base of the transistor is formed from a different material than either the emitter or collector. More specifically, the base of the DHBT is formed from a material having a smaller bandgap than that of the emitter or collector, thus having an emitter-base heterojunction and a collector-base heterojunction. DHBTs generally include ternary collectors, binary or ternary bases, and binary or ternary emitters such as AlGaAs/GaAs, InGaP/GaAs, or InGaP/InGaAs/GaAs for GaAs-based DHBTs or InP/InGaAs for InP-based DHBTs. Depending on the design, the base of the DHBT is formed using a single layer of the same material and doping, abrupt or relatively slow variations in the material and/or doping, or using multiple layers of different materials and perhaps doping levels. A power amplifier is an amplifier used to drive significant power levels. Examples of power amplifiers include amplifiers that drive a loudspeaker or the final stage of a transmitter. Although only NPN DHBTs are shown in FIG. 1, PNP DHBTs may be used.

The power amplifier IC 120 contains a reference circuit. The reference circuit includes a current mirror reference device 122 formed from one of the DHBTs in the power amplifier IC 120. In the current mirror reference device 122, the collector and base are shorted and the emitter is grounded. The shorted base-collector creates a diode current mirror that establishes the base-emitter voltage to be applied to the RF power amplifier 126 without actually impacting the RF power amplifier 126. The current mirror reference device 122 is scaled in size such that the periphery of the emitter is a fraction of that of the RF power amplifier 126. For example, if the periphery of the emitter of the RF power amplifier 126 is 8000 sq $\mu$m, the periphery of the emitter of the current mirror reference device 122 is 80 sq $\mu$m. Thus, for this example, the current through the RF power amplifier 126 is 100 times the current through the current mirror reference device 122.

The current mirror reference device 122 is fabricated close enough to the power amplifier circuit to encounter similar temperature fluctuations and have the same device characteristics as the power amplifier device 126. This allows the quiescent current of the power amplifier device 126 (the current flow into the device with no signals switching) to remain constant as a function of the temperature of the power amplifier device 126. The current mirror reference device 122 also replicates fluctuations in the characteristics of the power amplifier device 126 caused by process variations when fabricating the power amplifier device 126. The collector of the current mirror reference device 122 is connected to a reference terminal 130 of the power amplifier IC 120. The reference terminal 130 of the power amplifier IC 120 is connected to the Vin terminal 108 of the CMOS controller IC 102. This permits the CMOS controller IC 102 to monitor the base-emitter voltage of the current mirror reference device 122 and apply a desired voltage to the base-emitter voltage of the power amplifier device 126.

The power amplifier IC 120 contains one or more integrated ballast resistors 124. The ballast resistors 124 are connected between a bias terminal 128 of the power amplifier IC 120 and the base of the RF power amplifier 126. A DC bias is supplied to the bias terminal 128 through the ballast resistor 124. The base of the RF power amplifier 126 is also AC coupled to an RF terminal input 132 of the power amplifier IC 120. An RF signal is supplied to the RF terminal input 132 and is power amplified by the RF power amplifier 126. The emitter of the RF power amplifier 126 contains one or more emitter fingers, i.e. current paths that form the emitter. The emitter of the RF power amplifier 126 is grounded and the collector is connected to an RF output terminal 134 of the power amplifier IC 120. The RF power amplifier 126 is also supplied with power (Vcc) via the RF output terminal 134. The output of the RF power amplifier 126 is taken from the RF output terminal 134.

The ballast resistor 124 protects against current collapse and provides isolation between the DC bias and RF signal input. The isolation increases as the ballast resistor 124 increases. The ballast resistor 124 in series with the base of the transistor stabilizes the RF power amplifier 126, and distributes currents across multiple base-emitter fingers if present, thereby improving overall thermal performance and ruggedness over varying outputs.

The CMOS controller IC 102 includes an op-amp 106. While an ideal op-amp is an amplifier with infinite input impedance, infinite open-loop gain, zero output impedance, infinite bandwidth, and zero noise, the op-amp 106 is not ideal. Instead, the op-amp 106 has a different current-voltage (I-V) slope characteristic than that of an ideal op-amp. The voltage output of the op-amp 106 changes as a function of the current it is sourcing. Although not shown, the op-amp 106 has several parallel CMOS devices in the output stage. One of these devices is mirrored to sample the output current, which is then injected into the positive input of the op-amp 106, and to adjust the voltage accordingly. The fraction of the output current that is sampled determines the I-V slope of the output. Thus, the op-amp 106 is different from a simple voltage follower.

The constant current source 104 feeds the current mirror reference device 122 in the power amplifier IC 120. The base-emitter voltage generated by current mirror reference device 122 is supplied to the positive terminal of the op-amp 106. The output of the op-amp 106 (current) is supplied to the base of the RF power amplifier 126 through the ballast resistors 124. This circuit maintains a constant voltage at the base of the RF power amplifier 126 over temperature by tracking the base-emitter voltage of the current mirror reference device 122. The controller IC 102 sources as much current as required by the RF power amplifier 126 to maintain a desired output power.

Figure 2:
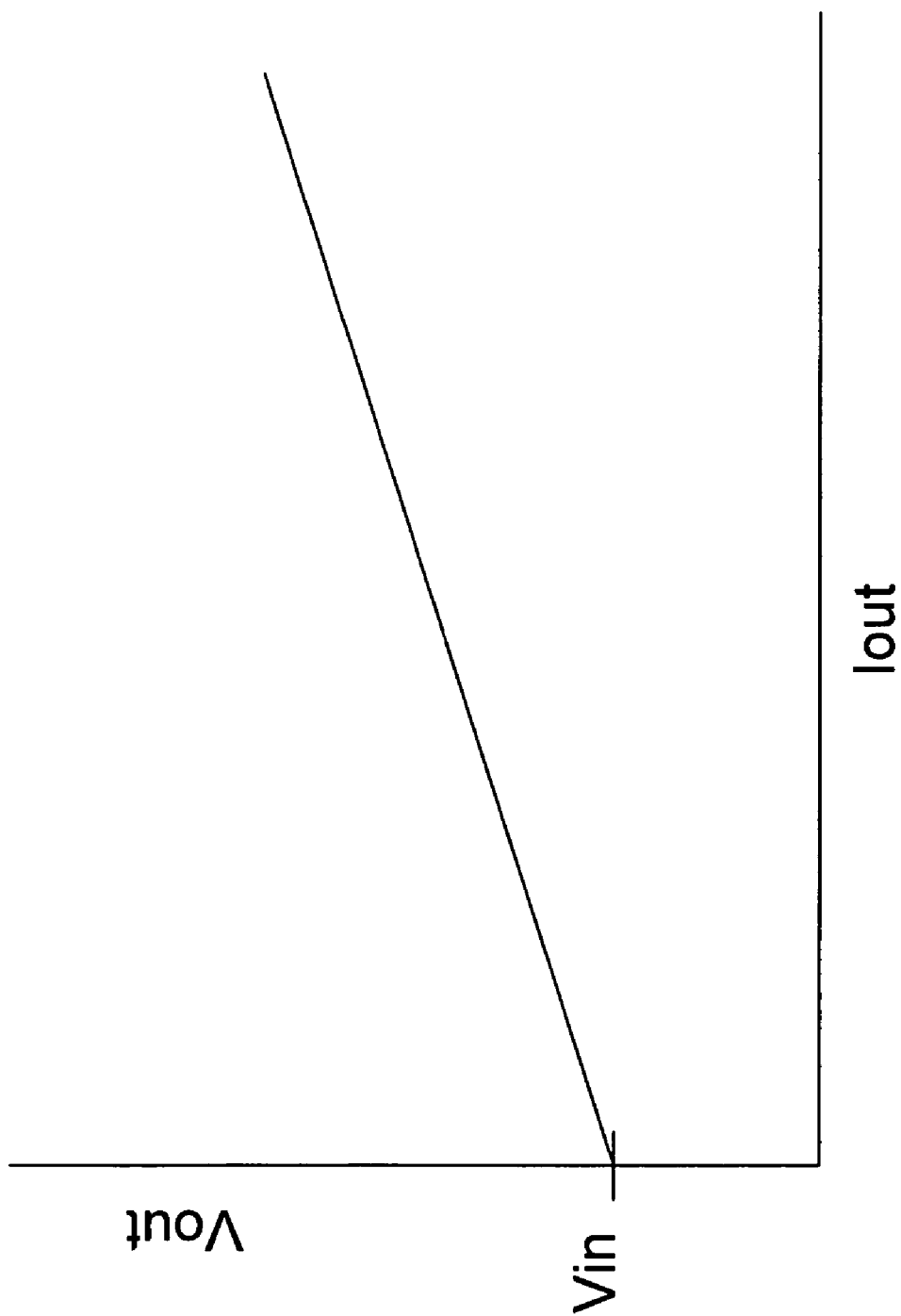
FIG. 2 is a current-voltage (I-V) curve of a current supply to the power amplifier.

Using an op-amp 106 having an I-V characteristic such as that shown in FIG. 2 permits compensation for the ballast resistors 124. More specifically, in one embodiment, the magnitude of the I-V slope of the op-amp 106 equals the value of the resistance of ballast resistors 124. By introducing this slope, as the RF induced bias current is reduced at lower RF power levels, the output voltage of the op-amp 106 is reduced in proportion to the reduction in bias current. Since this proportion is equal to the I-R drop in the ballast resistors 124, the voltage at the base of the RF power amplifier 126 is maintained at a constant level, both over temperature and also over RF output power level. This compensates for the effects of the ballast resistors 124 on the power amplifier circuit.

Stability and ruggedness, as well as the isolation between the RF signal and the DC bias increases as the resistance used to ballast the power amplifier increases. On the other hand, the power output, linearity and power-added-efficiency (PAE) performance increases with decreasing resistance used to ballast the power amplifier. The compensation, however, permits ballast resistors of larger resistance to be used with the equivalent performance of ballast resistors with lower resistance. In one example, the equivalent power output, linearity and PAE performance of an uncompensated 5 ballast resistor can be obtained using a compensated 15Ω ballast resistor. Similarly, the overall maximum ballast resistance may be able to be increased from about 5-15Ω to about 50Ω, depending on a number of factors. One such factor is the voltage drop across the ballast resistor—the voltage supplied by the op-amp only increases until it is somewhat near the supply voltage of the op-amp. The supply voltage of the op-amp is, for instance, the battery voltage of the cellular device in which the controller IC is housed.

Although full compensation of the ballast resistor is described, other embodiments are possible in which the op-amp only partially compensates for the ballast resistor. For example, the op-amp may compensate for anywhere from about 50% to about 100% of the resistance of the ballast resistor for stability reasons. This is to say that, if the base current increases, the base voltage may not increase by an amount to compensate fully for the voltage drop across the ballast resistor as runaway may be otherwise caused. However, if other effects, such as thermal effects, are present to stop runaway, then complete compensation may be used.

Although in FIG. 1, the output and negative input terminals of the op-amp 106 are directly connected together, other embodiments are possible. In another embodiment, the op-amp may have one or more active or passive elements (such as a variable resistor) in the feedback loop to vary the output voltage with respect to the current sourced. This permits a non-linear output characteristic to be achieved, if desired, dependent on the elements and arrangement used.

Figure 3:
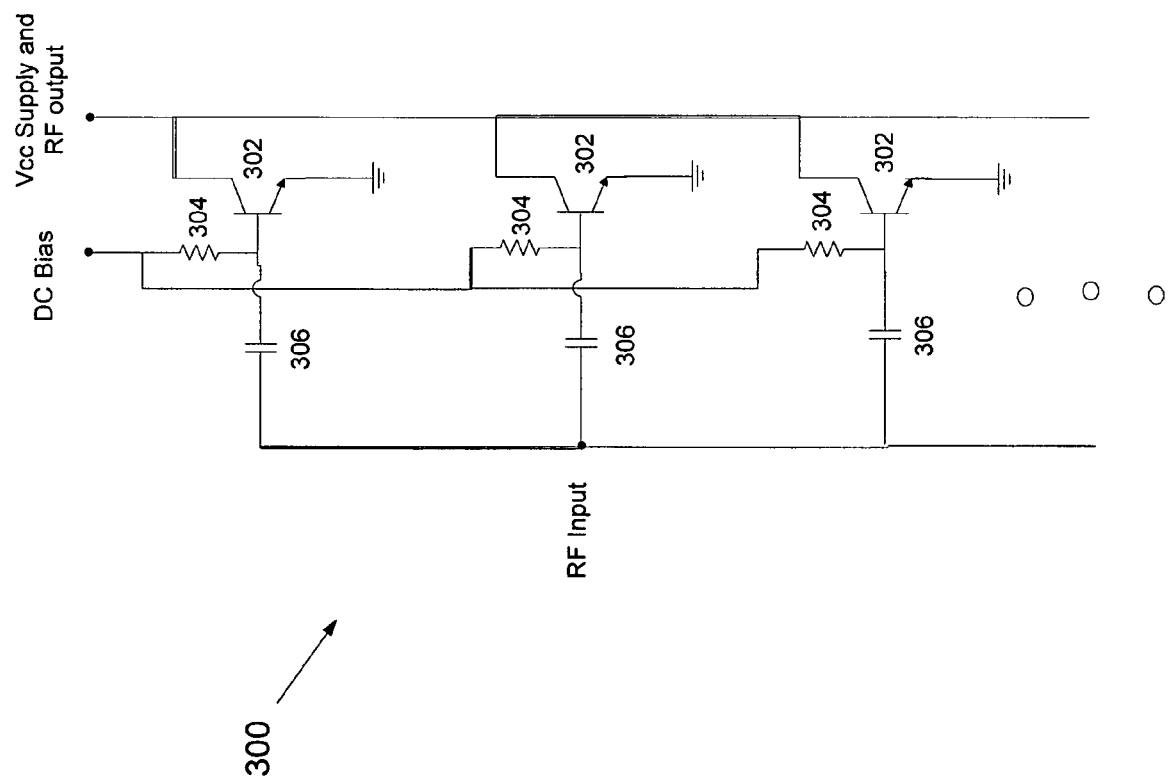
FIG. 3 is a circuit diagram of a second embodiment.
Figure 4:
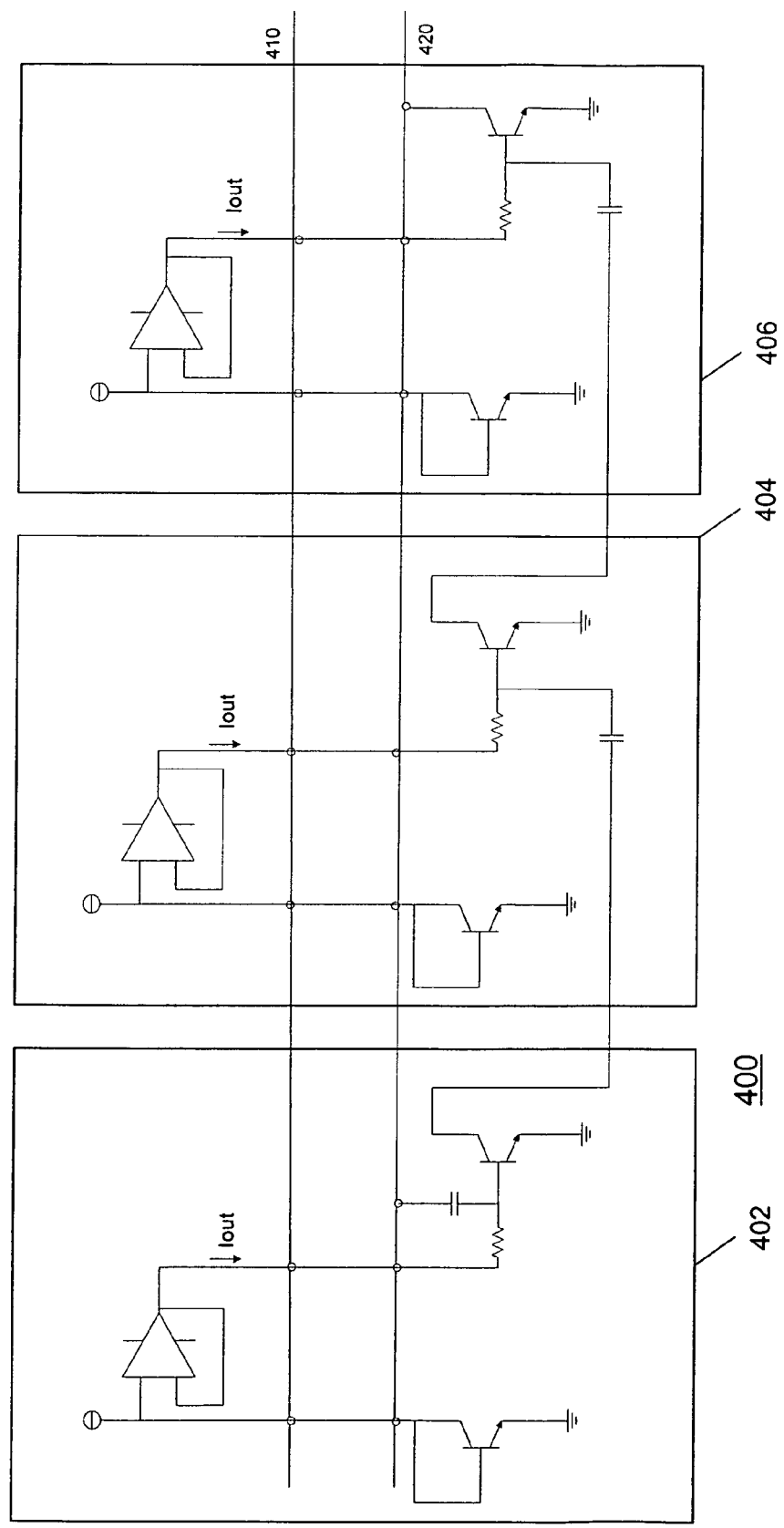
FIG. 4 is a circuit diagram of the embodiment shown in FIG. 3.

As shown in FIGS. 3 and 4, multiple power amplifiers 302, or cells, may be disposed in an array in the power amplifier IC 300. The circuit layout for a multiple power amplifier IC is similar to that of the single power amplifier IC shown in FIG. 1. Each power amplifier 302 has a base, collector, and emitter. The collector of each power amplifier 302 is connected to the Vcc supply and RF output terminal. The emitter of each power amplifier 302 is grounded. A DC bias is supplied to a DC bias terminal, which is connected to the base of each power amplifier 302 through a ballast resistor 304. The RF signal to be amplified is supplied to the RF input terminal, which is connected to the base of each power amplifier 302 through a coupling capacitor 306. Although only three power amplifiers are shown, any number of power amplifiers may be coupled together.

The power amplifiers 302 are identical DHBTs fabricated simultaneously from the same materials. Using identical power amplifiers helps prevent current collapse amongst the power amplifiers and permits the heat and power to be distributed more uniformly across the device array. The ballast resistors establish a uniform DC bias for each power amplifier in the array, thereby further insuring that the power and currents are distributed uniformly. One current mirror reference device can be used as a reference circuit for all of the power amplifiers, for several of the power amplifiers (e.g. one current mirror reference device for each pair of power amplifiers present), or for each power amplifier.

If the power amplifier has multiple stages, the amount of compensation for each stage may be adjusted independently to improve the linearity of the power amplifier according to the number of stages. This is to say that not only may the bias current be adjusted between stages, but in addition, the bias of individual stages with power output of each stage. Such an embodiment is shown in FIG. 4, which illustrates the controller IC 410 and power amplifier IC 420. Although only three power stages 402, 404, 406 of the power amplifier 400 are shown, more can be present. The output of each stage, provided from the collector of the RF power amplifier, is AC coupled to the base of the RF power amplifier in the following stage through a capacitor. The collector of the final stage 406 is taken as the output of the power amplifier 400. Each stage contains essentially the same components as the stage shown in FIG. 1: a current mirror reference RF power, an op-amp, a base ballast resistor, and an RF power amplifier.

Figure 5:
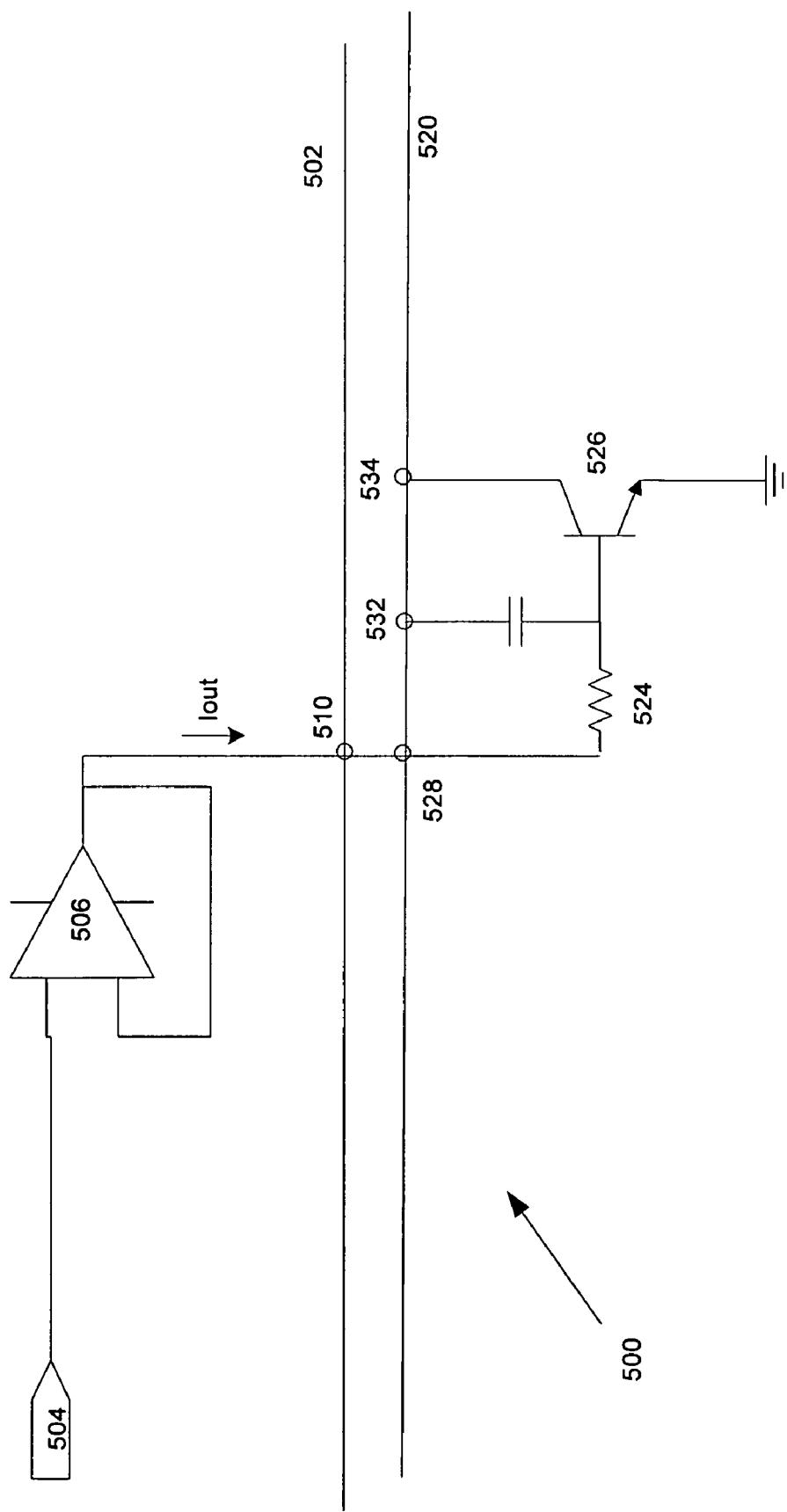
FIG. 5 is a circuit diagram of a third embodiment.

FIG. 5 illustrates another embodiment, similar in many aspects to the embodiment of FIG. 1. As shown in FIG. 5, the power amplifier device 500 includes two ICs: a controller IC 502 and a power amplifier IC 520.

The CMOS controller IC 502 contains an adjustable reference voltage source, such as the Digital to Analog Converter (DAC) 504 shown, and an op-amp 506. The DAC 504 is fabricated using a conventional circuit design. The DAC 504 is connected to the positive input terminal of the op-amp 506. The op-amp 506 has negative feedback between the output terminal and the negative input terminal of the op-amp 506. The output terminal and the negative input terminal of the op-amp 506 are connected together. The output of the op-amp 506 is connected to a Vout terminal 510 of the CMOS controller 502. The op-amp 506 has similar I-V characteristics as the op-amp 106 in FIG. 1.

The power amplifier IC 520 contains one or more RF power amplifiers 526 and one or more integrated ballast resistors 524. The ballast resistors 524 are connected between a bias terminal 528 of the power amplifier IC 520 and the base of the RF power amplifier 526. A DC bias is supplied to the bias terminal 528 through the ballast resistor 524. The base of the RF power amplifier 526 is also AC coupled to an RF terminal input 532 of the power amplifier IC 520. An RF signal is supplied to the RF terminal input 532 and is power amplified by the RF power amplifier 526. The emitter of the RF power amplifier 526 is grounded and the collector is connected to an RF output terminal 534 of the power amplifier IC 520. The RF power amplifier 526 is also supplied with power (Vcc) via the RF output terminal. The output of the RF power amplifier 526 is taken from the RF output terminal 534.

The DAC 504 sets the voltage at the input to the op-amp 506 and thereby set the bias voltage at Vout of the controller IC 502. The DAC 502 is internal to the electronic device, e.g. handset or cell phone. Adjustments are made to the DAC when the handset is assembled, thereby optimizing the DAC setting for the particular power amplifier. This allows for each power amplifier to be set individually. Unlike the arrangement of FIG. 1, a current mirror reference device may or may not be present in the power amplifier. If the current mirror reference device is not present, the overall process and design complexity of the power amplifier is reduced, but also compensation of the thermal shifts of the RF power amplifier may be more limited. Also, since the op-amp is used as a simple voltage follower, compensation for the change in voltage at the base of the RF power amplifier caused by the changes in base current due to varying RF power levels may be more limited.

Figure 6:
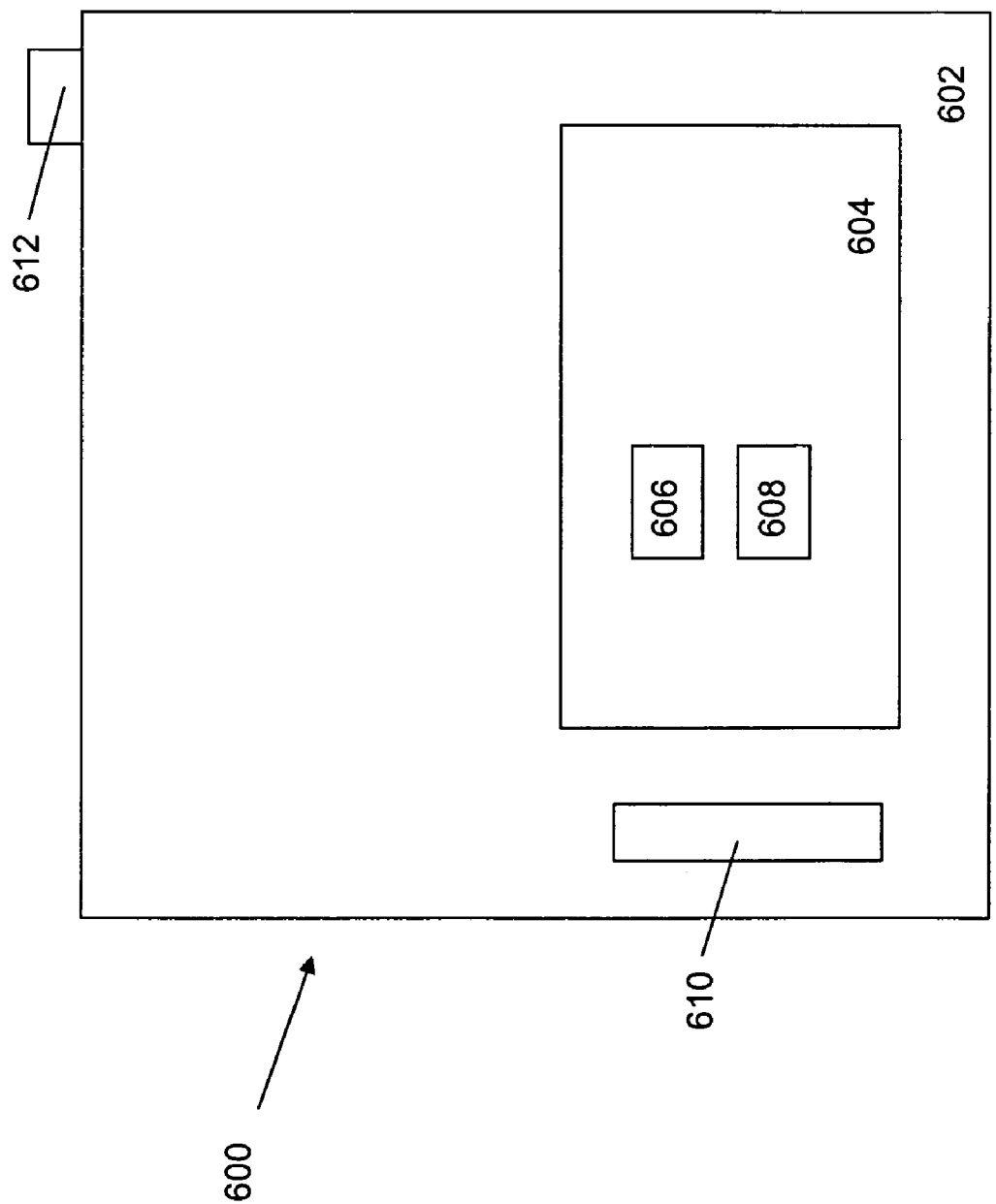
FIG. 6 is an electronic device employing the circuit of one of the embodiments.

An electronic device 600 using the ICs is shown in FIG. 6. The electronic device may be, for example, a portable electronic device such as a cellular telephone. The electronic device 600 contains a circuit board 604 on which the controller IC 606 and amplifier IC 608 are mounted. Other components such as ICs and wirings are present but are not shown for simplicity. A battery 610 or other power source supplies power to the circuits on the circuit board 604. The battery 610 and circuit board 604 are contained within a housing 602. An antenna 612 may be disposed either inside or outside the housing 602. Various inputs and outputs such as a display, keyboard, microphone/headphone jack, USB port, IR port, speakerphone, camera, joystick, jog wheel, etc. . . . are not shown in FIG. 6 but may be present as desired. The sizes and placement of the components are merely for illustration and may be different depending on the design of the electronic device.

Using a compensating DC bias circuit such as the op-amp shown in FIG. 1 increases characteristics of the power amplifier such as efficiency and linearity. The compensation also improves the current drain of the power amplifier at low power levels. Generally, the bias voltage (output of the control circuit/input of the power amplifier IC) is set high enough to overcome the voltage drop of the ballast resistor and provide the desired output power at maximum power conditions. However, if the bias voltage remains constant over all conditions, when less than the maximum power output is desired, the quiescent current is larger than needed, leading to increased power drain. Since the output of a conventional non-compensating op-amp is maintained at a constant level, the voltage drop across the ballast resistor is reduced due to the reduced RF induced current. As the voltage at the base of the RF power amplifier is increased, the collector quiescent current is maintained at a higher level than is necessary. Using conventional bias circuits significantly reduces the efficiency and linearity of the overall power amplifier device as well as causing excess current drain. However, in the circuits shown, the current sourced by the op-amp is dynamically adjusted so that less current is used at lower power conditions. Thus, when the RF power amplifier is operated at lower output power, the RF induced current is reduced, which in turn reduces the current pulled from the op-amp through the ballast resistor.

In conventional arrangements, the current into the reference device is increased linearly, thereby permitting the RF power amplifier to track the diode characteristic of the reference device. The amount of current supplied by the current source is varied, which in turn changes the diode voltage of the reference device, which in turn alters the voltage at the base of the RF power amplifier. The bias voltage thus increases in a non-linear fashion while the current increases linearly, which increases the power output of the power amplifier in a smoother fashion than merely increasing the bias voltage linearly. As shown in FIG. 1, however, a fixed bias is applied to the RF power amplifier and compensates for the ballast resistance. That is, a non-fixed bias is supplied to the power amplifier IC. This bias is not changed to provide power control, instead the power of the RF power amplifier is controlled by changing the voltage supplied to the collector of the RF power amplifier.

Although the RF power amplifier shown in the figures is a BJT, a FET may be used in other embodiments. In this case, unlike the arrangement in the figures in which the BJT in each cell has a separate resistor, that is, the resistors are distributed, arrangements which use a FET in each cell may have a single resistor connected to the gates of several or all of the cells. Other modifications of the circuitry shown for application to FET amplifiers, for example, may be known by those of skill in the art. Similarly, although base ballasting has been described, emitter ballasting (connecting a resistance to the emitter rather than the base) may be used. However, base ballasting usually provides better power performance than emitter ballasting.

In summary, a power amplifier circuit contains a controller IC and a power amplifier IC. The controller IC has an op-amp that supplies current to the base of a power amplifier in the power amplifier IC through one or more ballast resistors to DC bias the power amplifier. The op-amp has an output I-V slope that compensates for the voltage drop across the ballast resistor such that the current from the op-amp decreases as the output power from the power amplifier decreases.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:
1. A circuit comprising:
 a controller circuit;
 a power amplifier containing a radio frequency (RF) power amplifier having an RF signal input terminal and a bias terminal to which a DC signal is supplied through a resistor; and a bias source having a current or voltage characteristic with a slope that compensates for a resistance value of the resistor, wherein the controller supplies the DC signal to the power amplifier through the resistor.

2. The circuit of claim 1, wherein the controller circuit comprises an operational amplifier.

3. The circuit of claim 2, wherein a negative input and an output of the operational amplifier are connected together.

4. The circuit of claim 2, wherein the slope substantially equals the resistance of the resistor.

5. The circuit of claim 2, wherein the controller circuit comprises a voltage source that applies a fixed voltage to a positive input of the operational amplifier.

6. The circuit of claim 5, wherein the bias source comprises an adjustable reference voltage source.

7. The circuit of claim 6, wherein the adjustable reference voltage source comprises a digital-to-analog converter.

8. The circuit of claim 1, wherein the power amplifier further comprises a reference circuit that generates a base-emitter voltage that is applied to the power amplifier.

9. The circuit of claim 8, wherein the controller circuit comprises an operational amplifier having a current-voltage characteristic with a slope of a magnitude that compensates for a resistance of the resistor and whose positive input is connected with the reference circuit.

10. The circuit of claim 9, wherein a negative input and an output of the operational amplifier are connected together.

11. The circuit of claim 9, wherein the slope substantially equals the resistance of the resistor.

12. The circuit of claim 9, wherein the positive input of the operational amplifier is connected to a constant current source.

13. The circuit of claim 8, wherein the reference circuit comprises a current mirror reference device that includes a diode-connected transistor and is disposed close enough to the power amplifier to mirror fluctuations in the power amplifier caused by temperature fluctuations.

14. The circuit of claim 1, wherein the power amplifier comprises a bipolar transistor having a base to which the RF signal and DC signal are supplied.

15. The circuit of claim 1, wherein the power amplifier comprises a field effect transistor having a gate to which the RF signal and DC signal are supplied.

16. The circuit of claim 1, wherein the bias source compensates for the full voltage drop across the resistor.

17. The circuit of claim 1, wherein the bias source compensates for between about 50% and about 100% of the voltage drop across the resistor.

18. The circuit of claim 17, wherein the bias source compensates for only a portion of the voltage drop across the resistor.

19. A circuit comprising:
a controller integrated circuit (IC); and
a power amplifier IC connected to the controller IC; the power amplifier IC containing a radio frequency (RF) power amplifier having an RF signal input terminal and a bias terminal to which a compensated DC bias is supplied;
the controller IC supplying the compensated DC bias to the power amplifier, the compensated bias compensating for a voltage drop across a resistance between the controller IC and the power amplifier, and
wherein the power amplifier IC further comprises a current mirror that establishes a base-emitter voltage applied to the power amplifier and is disposed close enough to the power amplifier to mirror fluctuations in the base-emitter voltage caused by temperature fluctuations.

20. The circuit of claim 19, wherein the controller IC further comprises an adjustable reference voltage source that applies a voltage to an input terminal of the compensating means.

21. The circuit of claim 20, wherein the adjustable reference voltage source comprises a digital-to-analog converter.

22. The circuit of claim 19, wherein the compensating means compensates for the full voltage drop across the ballast resistor.

23. The circuit of claim 19, wherein the compensating means compensates for between about 50% and about 100% of the voltage drop across the ballast resistor.

24. The circuit of claim 19, wherein the compensating means compensates for only a portion of the voltage drop across the ballast resistor.

25. A method comprising:
connecting a controller IC and a power amplifier IC, the power amplifier IC containing a power amplifier;
compensating for a voltage drop across a resistance between the controller IC and the power amplifier by supplying a compensated bias signal to the power amplifier; and
amplifying an RF signal supplied to the power amplifier.

26. The method of claim 25, further comprising using an operational amplifier to supply the bias signal and compensate for the voltage drop.

27. The method of claim 26, wherein a positive input of the operational amplifier is connected to a constant current source.

28. The method of claim 26, wherein a positive input of the operational amplifier is connected to a fixed voltage source.

29. The method of claim 28, wherein the fixed voltage source comprises an adjustable reference voltage source.

30. The method of claim 29, wherein the adjustable reference voltage source comprises a digital-to-analog converter.

31. The method of claim 27, further comprising establishing a base-emitter voltage to be applied to the power amplifier using a reference circuit that mirrors fluctuations in the power amplifier caused by temperature fluctuations.

32. The method of claim 31, wherein the reference circuit is connected to the positive input of the operational amplifier.

33. The method of claim 25, further comprising compensating for the full voltage drop across the resistance.

34. The method of claim 25, further comprising compensating for between about 50% and 100% of the voltage drop across the resistance.

35. The method of claim 34, further comprising compensating for only a portion of the voltage drop across the resistance.

36. A device comprising:
an amplifier having an signal input terminal and a bias input terminal to which a bias signal is supplied through a resistor;
a semiconductor circuit disposed such that the semiconductor circuit has a variation of temperature similar to that of the amplifier, and the bias signal is varied in accordance with a temperature-dependent characteristic of the semiconductor circuit.

37. The circuit of claim 36, wherein the variation of the bias signal is substantially proportional to a voltage drop across the resistor.

* * * * *